(12) United States Patent
Shimoida et al.

(10) Patent No.: US 6,737,677 B2
(45) Date of Patent: May 18, 2004

(54) WIDE BANDGAP SEMICONDUCTOR DEVICE AND METHOD FOR MANUFACTURING THE SAME

(75) Inventors: Yoshio Shimoida, Yokosuka (JP); Saichirou Kaneko, Yokosuka (JP); Hideaki Tanaka, Yokosuka (JP); Masakatsu Hoshi, Yokohama (JP)

(73) Assignee: Nissan Motor Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/410,188

(22) Filed: Apr. 10, 2003

(65) Prior Publication Data

US 2003/0201482 A1 Oct. 30, 2003

(30) Foreign Application Priority Data

Apr. 24, 2002 (JP) ...................................... P2002-121807

(51) Int. Cl.[7] ................. H01L 31/0312; H01L 31/0328; H01L 31/0336; H01L 31/072; H01L 31/109
(52) U.S. Cl. ..................... 257/77; 257/192; 257/263; 257/266
(58) Field of Search .................. 257/77, 76, 192, 257/194, 195, 263, 266, 279

(56) References Cited

U.S. PATENT DOCUMENTS 5,451,800 A * 9/1995 Mohammad ................. 257/191

FOREIGN PATENT DOCUMENTS

JP 2000-299475 10/2000

* cited by examiner

*Primary Examiner*—Ngân V. Ngô
(74) *Attorney, Agent, or Firm*—McDermott, Will & Emery

(57) ABSTRACT

The present invention provides a wide bandgap semiconductor device encompassing: (a) a drift layer of a first conductivity type made of a wide bandgap semiconductor material; (b) a body region of a second conductivity type made of the wide bandgap semiconductor material, disposed at the top surface of and in the drift layer; (c) a source region of the first conductivity type disposed in the body region; (d) a channel layer of the first conductivity type, disposed in the body region neighboring to the source region and further disposed in the drift layer; and (e) a gate electrode including semiconductor layer at the bottom so that the semiconductor layer directly contact with the top surface of the channel layer, the semiconductor layer made of a semiconductor material having a different bandgap energy from that of the wide bandgap semiconductor material.

18 Claims, 6 Drawing Sheets

WIDE BANDGAP SEMICONDUCTOR DEVICE AND METHOD FOR MANUFACTURING THE SAME

BACKGROUND OF THE INVENTION

1. Field of the Invention

The instant invention relates to a wide bandgap semiconductor device and a method for manufacturing the wide bandgap semiconductor device, which are particularly adapted for high voltage applications. The invention particularly relates to a field effect transistor (FET) using wide bandgap semiconductor as a base material and a method for manufacturing the FET.

2. Description of the Related Art

Historically, early stage in semiconductor industry, silicon (Si) material having a bandgap energy $Eg=1.1$ eV, or the gallium arsenide (GaAs) material having a bandgap energy $Eg=1.4$ eV has been firstly adopted for practical use. Compared with these preceding semiconductor materials, other semiconductor materials having wider bandgap energy Eg than these Si and GaAs are now referred as "wide bandgap semiconductor". For example, zinc telluride (ZnTe) having a bandgap energy $Eg=2.2$ eV, cadmium sulfide (CdS) having a bandgap energy $Eg=2.4$ eV, zinc selenide (ZnSe) having a bandgap energy $Eg=2.7$ eV, a gallium nitride (GaN) having a bandgap energy $Eg=3.4$ eV, zinc sulphide (ZnS) having a bandgap energy $Eg=3.7$ eV and diamond having a bandgap energy $Eg=5.5$ eV are well known as the examples for the wide bandgap semiconductors. In addition, silicon carbide (SiC) is another example of wide bandgap semiconductor. The bandgap energy Eg of 2.23 eV is reported for 3C—SiC, 2.93 eV is reported for 6H—SiC, and 3.26 eV is reported for 4H—SiC.

Generally, these wide bandgap semiconductors are superior in thermal and chemical stability, and wide bandgap semiconductors are superior in radiation immunity. In particular, because SiC is superior in these characteristics, applications in various industrial fields are expected. For example, SiC FETs are expected for high frequency devices and power devices having high reliability and stability.

In a channel region of an earlier SiC FET, a depletion layer is extended from in a gate region when a reverse bias is applied to a gate electrode so as to block current of carriers flowing from a source region to a drain region from, thereby achieving the off-state (See Japanese Patent Laid-Open No. 2000-299475). And the current flowing from the source to drain regions is controlled by drain voltage in an on-state by drain voltage. In other words, the negative feedback effect ascribable to the resistance in the channel caused by depletion layer at pinch off potential provides saturated drain current versus drain voltage characteristics, wherein the depletion layer extends to a drift region from the interface between a p-body regions and the drift region. In this way, switching operations of high current with high voltage is expected for the SiC FETs.

SUMMARY OF THE INVENTION

However, in the earlier SiC FETs, it is necessary to electrically insulate the gate electrode from the source region, which provides the limitation of the miniaturization of cell. And, there was a problem that reduction of the specific on-resistance normalized by chip area is not enough. In addition, there was another problem that the performance of the Schottky barrier formed between the gate electrode and SiC layer is determined uniquely by the kind of metallic material being employed in the Schottky gate electrode.

In addition, it is difficult to obtain a high breakdown voltage in the Schottky gate electrode structure. To obtain a high breakdown voltage, it is better to use nickel (Ni) among various metallic materials, because Ni has a high work function. However, because the etching of Ni film by photolithographic process is difficult, we must employ the lift-off process to delineate the Ni Schottky gate electrode, which unsuitable for the miniaturization of the SiC devices.

In view of these situations, it is an object of the present invention to provide a wide bandgap semiconductor device, which can achieve the miniaturization of the wide bandgap semiconductor device, reducing enough the specific on-resistance of the wide bandgap semiconductor device, which is normalized by the chip area of the wide bandgap semiconductor device.

Another object of the present invention is to provide a wide bandgap semiconductor device having high breakdown voltage and the manufacturing method of the wide bandgap semiconductor device, by which a Schottky gate structure having a desired barrier height can be formed selectively and easily.

To achieve the above-mentioned objects, a feature of the present invention inheres in a wide bandgap semiconductor device encompassing: (a) a drift layer of a first conductivity type made of a wide bandgap semiconductor material; (b) a body region of a second conductivity type opposite to the first conductivity type made of the wide bandgap semiconductor material, disposed at the top surface of and in the drift layer; (c) a source region of the first conductivity type made of the wide bandgap semiconductor material, disposed at the top surface of and in the body region; (d) a channel layer of the first conductivity type made of the wide bandgap semiconductor material, disposed at the top surface of and in the body region neighboring to the source region and further disposed at the top surface of and in the drift layer; and (e) a gate electrode including semiconductor layer at the bottom so that the semiconductor layer directly contact with the top surface of the channel layer, the semiconductor layer made of a semiconductor material having a different bandgap energy from that of the wide bandgap semiconductor material.

Another feature of the present invention inheres in a wide bandgap semiconductor device made of wide bandgap semiconductor material for controlling current flowing from source means to drain means by gate means, comprising: (a) drift means for transporting carriers by drift field between the source means and drain means; (b) body means disposed in the drift means for storing the carriers to be injected into the drift means; (c) source means disposed in the body means for providing the carriers so that the carriers can serve as the current flowing from the source means to the drain means; (d) channel means disposed at the top surface of the body means neighboring to the source means and further disposed at the top surface of the drift means for providing a current path between the source means and drain means; and (e) gate means directly contact with the top surface of the channel means so that an edge of gate means reaches to the source means, for controlling potential in the channel means, and simultaneously for achieving electrical isolation between the gate means and source means.

Still another feature of the present invention inheres in a method for manufacturing a wide bandgap semiconductor device, encompassing the steps of: (a) forming a drift layer of a first conductivity type made of a wide bandgap semiconductor material on a base material made of the wide bandgap semiconductor material; (b) forming a body region of a second conductivity type opposite to the first conductivity type made of the wide bandgap semiconductor material at the top surface of and in the drift layer; (c) forming a source region of the first conductivity type made of the wide bandgap semiconductor material at the top surface of and in the body region; (d) forming a channel layer of the first conductivity type made of the wide bandgap semiconductor material at the top surface of and in the body region neighboring to the source region and further at the top surface of and in the drift layer; (e) depositing a semiconductor layer having a different bandgap energy from that of the wide bandgap semiconductor material directly on the channel layer; and (f) doping impurity atoms from the top surface of the semiconductor layer.

Yet still another feature of the present invention inheres in a method for manufacturing a wide bandgap semiconductor device, encompassing the steps of: (a) forming a drift layer of a first conductivity type made of a wide bandgap semiconductor material on a base material made of the wide bandgap semiconductor material; (b) forming a body region of a second conductivity type opposite to the first conductivity type made of the wide bandgap semiconductor material at the top surface of and in the drift layer; (c) forming a channel layer of the first conductivity type made of the wide bandgap semiconductor material at the top surface of and in the body region neighboring to the source region and further at the top surface of and in the drift layer; (d) depositing a semiconductor layer having a different bandgap energy from that of the wide bandgap semiconductor material directly on the channel layer; (e) delineating the semiconductor layer so as to form a window portion, exposing a portion of the body region, and to form a pattern of a gate electrode; and (g) doping the first conductivity type impurity atoms from the top surface of the semiconductor layer so as not dope the bottom portion of the semiconductor layer, and simultaneously doping the portion of the body region exposed in the window portion, thereby simultaneously forming the gate electrode directly contacting with the top surface of the channel layer and a source region of the first conductivity type at the top surface of and in the body region.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

DETAILED DESCRIPTION OF THE EMBODIMENTS

Figure 1:
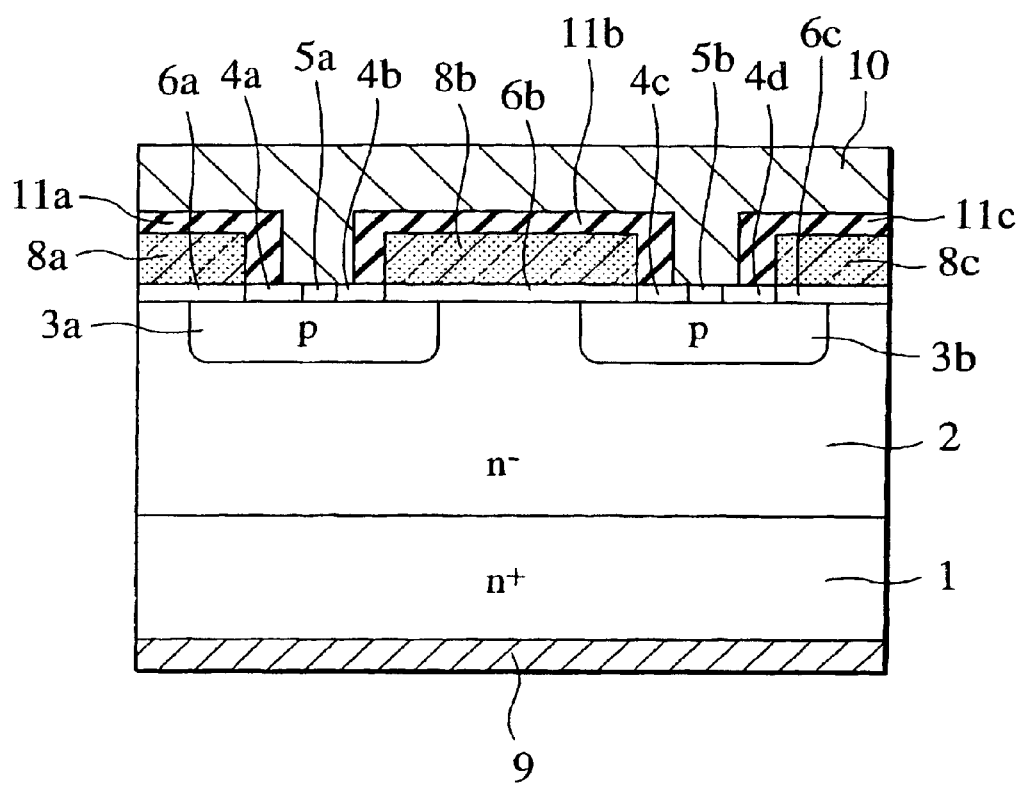
FIG. 1 is a cross sectional view of a wide bandgap semiconductor device of the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. For example, in FIGS. 2A–2G and 3A–3G of the drawings, as if the area sizes of the body contact regions 5a, 5b might change, but, actually, they can keep essentially same size. It being understood the indicator "+" in the drawings indicates relatively heavy doping and the indicator "−" in the drawings indicates relatively lightly doping.

In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set forth in detail in order not unnecessary obscure the present invention. Prepositions, such as "on" is defined with respect to a planar surface of the substrate, regardless of the orientation the substrate is actually held. A layer is on another layer even if there are intervening layers.

Although the definition of the "wide bandgap semiconductor" is a little bid vague in the art, the semiconductor material having bandgap energy Eg equal to and larger than 2.2 eV is defined as the wide bandgap semiconductor in this specification.

First Embodiment (Device Structure)

As shown in FIG. 1, a wide bandgap semiconductor device of the first embodiment encompassing: (a) a drift layer 2 of a first conductivity type (n-type) made of a wide bandgap semiconductor material (SiC); (b) body regions 3a, 3b of a second conductivity type (p-type) made of the wide bandgap semiconductor material (SiC), disposed at the top surface of and in the drift layer 2; (c) a source regions 4a, 4b, 4c, 4d of the first conductivity type (n-type) disposed in the body regions 3a, 3b; (d) a channel layers 6a, 6b, 6c of the first conductivity type (n-type), disposed in the body regions 3a, 3b neighboring to the source regions 4a, 4b, 4c, 4d and further disposed in the drift layer 2; and (e) a gate electrodes 8a, 8b, 8c including insulating semiconductor layer at the bottom so that the insulating semiconductor layer directly contact with the top surface of the channel layers 6a, 6b, 6c, the insulating semiconductor layer made of a semiconductor material (Si) having a different bandgap energy Eg from that of the wide bandgap semiconductor material (SiC). Here the drift layer 2 serves as means for transporting carriers by drift field between the source regions 4a, 4b, 4c, 4d and drain region 1. The body regions 3a, 3b serves as means for storing the carriers to be injected into the drift layer 2. The source regions 4a, 4b, 4c, 4d serves as means for providing the carriers so that the carriers can serve as the current flowing from the source regions 4a, 4b, 4c, 4d to the drain region 1. And channel layers 6a, 6b, 6c serves as means for providing a current path between the source regions 4a, 4b, 4c, 4d and the drain region 1.

Please note that FIG. 1 shows a part of a wide bandgap semiconductor device of the first embodiment, that is, a cross sectional view representing only two unit cells of the wide bandgap semiconductor device is illustrated. Actually a plurality of unit cells more than two can be connected in parallel to achieve desired current handling capability.

As the drift layer 2, an n-type SiC epitaxial layer 2 serves in the first embodiment. That is on a base material such as an n-type SiC substrate 1 having a high impurity concentration, the n-type SiC epitaxial layer (drift layer) 2 having a low impurity concentration is formed. The thickness of the SiC substrate 1 is several hundreds $\mu$m, for example. Thickness of the epitaxial layer (drift layer) 2 is several tens $\mu$m to several $\mu$m, and the epitaxial layer 2 has an impurity concentration of around $10^{15}$–$10^{17}$ cm$^{-3}$. At the top surface of and in the epitaxial layer 2, p-body regions 3a, 3b are formed. At the top surface of and in the p-body region 3a, n-type source regions 4a, 4b of high impurity concentration are formed. And at the top surface of and in the p-body region 3b, n-type source regions 4c, 4d of high impurity concentration are formed.

In addition, a p-type body contact region 5a of high impurity concentration is formed in the p-body region 3a so that the body contact region 5a is surrounded by these source regions 4a, 4b. Although as if two source regions 4a, 4b are existing on the plane of cross sectional view, the two source regions 4a, 4b are merged in one body in the deep position from the plane of the paper so that the source region 4a, 4b surrounds the periphery of the body contact region 5a in a ring shape. And, another p-type body contact region 5b of high impurity concentration is formed in the p-body region 3b so that the body contact region 5b is surrounded by the source regions 4c, 4d. The source regions 4c, 4d are merged in one body in the deep position from the plane of the paper so that the source region 4c, 4d surrounds the periphery of the body contact region 5b in a ring shape. In top surface portions of the epitaxial layer (drift layer) 2, aside from the area where the source regions 4a, 4b, 4c, 4d, the p-type body contact regions 5a, 5b, the n-type wide bandgap channel layers 6a, 6b, 6c are formed, respectively.

Gate electrodes 8a, 8b, 8c are formed so that they can contact with the upper part of the n-type wide bandgap channel layers 6a, 6b, 6c, respectively. Each of the gate electrodes 8a, 8b, 8c are made of impurity-doped-polysilicon. Therefore, the material of the gate electrodes 8a, 8b, 8c has a different band gap energy from that of wide bandgap channel layers 6a, 6b, 6c. Instead of the polysilicon, the single crystalline silicon or the amorphous silicon can be used, as long as the band gap energy is different from that of wide bandgap channel layers 6a, 6b, 6c. In the first embodiment, impurities of desired doping profile are doped in the polysilicon layer, the doping profile is measured along the thickness direction from the top surface side of the polysilicon layer, so that Schottky barriers can be formed between the n-type wide bandgap channel layers 6a, 6b, 6c and the gate electrodes 8a, 8b, 8c, respectively. In the doping profile, the impurity concentration gradually decreases from top to bottom so that the bottom portions of the polysilicon layer, where edges of the gate electrodes 8a, 8b, 8c are positioned closely to the source regions 4a, 4b, 4c, 4d, are very lightly doped or not doped with impurity. That is, each of the gate electrodes 8a, 8b, 8c has a graded doping profile, each manifesting locally and spatially different impurity concentration in the thickness direction, achieving very low impurity concentration at the bottom surface of the gate electrodes 8a, 8b, 8c.

A source electrode 10 made of metallic film keeps electrical isolation with the gate electrodes 8a, 8b, 8c by interlayer insulation films 11a, 1b, 11c, respectively. The source electrode 10 achieves the ohmic contact with the source regions 4a, 4b, 4c, 4d. Further, the source electrode 10 are connected to the p-type body contact regions 5a, 5b so that the potential of the p-body regions 3a, 3b can be fixed. On the bottom surface of the SiC substrate 1, a drain electrode 9 is disposed so that the drain electrode 9 can make an ohmic contact with the SiC substrate 1.

(Operation of Device)

(a) Off-State:

In the off-state of the wide bandgap semiconductor device according to the first embodiment, the potential of the gate electrodes 8a, 8b, 8c are set equal to the potential of the source electrode 10 so that each of the n-type wide bandgap channel layers 6a, 6b, 6c is pinched off by means of depletion layers sustained by the existing built-in potentials across the pn-junctions between the p-body regions 3a, 3b and the n-type wide bandgap channel layers 6a, 6b, 6c. In the pinch off condition, a part of the current path between the source electrode 10 and drain electrode 9 is locally closed, achieving the off-state of the wide bandgap semiconductor device. In the off-state of the wide bandgap semiconductor device, when a higher voltage is applied to the drain electrode 9, the depletion layer extends from a pn junction formed between the n-type the drift layer 2 and the p-body regions 3a, 3b so that a higher breakdown voltage can be achieved.

In the device configuration shown in FIG. 1, the edges of the gate electrodes 8a, 8b, 8c touch the source regions 4a, 4b, 4c, 4d respectively. If earlier metallic materials are employed for the gate electrodes 8a, 8b, 8c, short-circuit failure will occur between the gate electrodes 8a, 8b, 8c and the source electrode 10. However, since each of the gate electrodes 8a, 8b, 8c has the graded doping profile so as to manifest very low impurity concentration at the bottom surface of the gate electrodes 8a, 8b, 8c, the perfect electrical isolation can be achieved between the gate electrodes 8a, 8b, 8c and the source electrode 10. Because the non-doped polysilicon film manifest very high resistivity, the bottom surfaces of the gate electrodes 8a, 8b, 8c serve as electric insulators respectively. Therefore, even if the upper portions of the respective gate electrodes 8a, 8b, 8c are heavily doped with impurities, and if the gate electrodes 8a, 8b, 8c are in contact with the source regions 4a, 4b, 4c, 4d respectively, excellent electric isolation can be achieved between the gate electrodes 8a, 8b, 8c and the source regions 4a, 4b, 4c, 4d, actually.

In addition, the voltages applied to the gate electrodes 8a, 8b, 8c are 10 to 20 volts at most, the structure of the gate electrodes 8a, 8b, 8c can withstand these voltages.

(b) On-State:

In the on-state of the wide bandgap semiconductor device according to the first embodiment, a positive voltage is applied to the gate electrodes 8a, 8b, 8c with reference to the potential of the source electrode 10, during a high voltage is applied to the drain electrode 9 with reference to the potential of the source electrode 10. In this bias condition, the depletion layers just under the gate electrodes 8a, 8b, 8c retreat in the respective wide bandgap channel layers 6a, 6b, 6c so as to provide current paths. Then, current flows from the drain electrode 9, through the SiC substrate 1, the SiC drift layer 2, the wide bandgap channel layers 6a, 6b, 6c to the source regions 4a, 4b, 4c, 4d, and finally to the source electrode 10.

As stated above, the current path between the source electrode 10 and the drain electrode 9 is blocked by the depletion layers extending from the interfaces between the p-body regions 3a, 3b and the n-type wide bandgap channel layers 6a, 6b, 6c, when the potential of the gate electrodes 8a, 8b, 8c is set equal to the potential of the source electrode 10. In this bias condition, since the gate electrodes 8a, 8b, 8c are made of graded-doped-polysilicon, in which the impurity concentration of the lower part is low, electrons cannot move. On the contrary, these depletion layers in the wide bandgap channel layers 6a, 6b, 6c will disappear when the positive voltage is applied to the gate electrodes 8a, 8b, 8c with reference to the potential of the source electrode 10, and the current path between the source electrode 10 and the drain electrode 9 conducts.

According to the device configuration shown in FIG. 1, the gate electrodes 8a, 8b, 8c can be positioned to be contact with the source regions 4a, 4b, 4c, 4d so that a plurality of unit cells can be arranged extremely densely, thereby increasing the degree of on-chip integration. Thus, the wide bandgap semiconductor device according to the first embodiment achieves a technical advantage of enabling the miniaturization of the wide bandgap semiconductor device. Furthermore the wide bandgap semiconductor device according to the first embodiment can reduce the specific on-resistance normalized by the chip area.

Because the barrier height between the wide bandgap channel layers 6a, 6b, 6c and the gate electrodes 8a, 8b, 8c can be freely changed by controlling the doping profile, or the impurities doped in the polysilicon layer serving as the gate electrodes 8a, 8b, 8c, it is possible to improve the off-performances of the wide bandgap semiconductor device. Therefore, the wide bandgap semiconductor device having high breakdown voltage with normally-off characteristics can be achieved.

As shown in FIG. 1, in the wide bandgap semiconductor device according to the first embodiment, the vertical configuration that the drain electrode 9 is formed at the bottom surface of the SiC substrate 1 was explained, but the drain electrode can be disposed on the top surface to implement a lateral device configuration. It is a matter of course that very similar technical advantages can be achieved by the lateral device configuration.

(Manufacturing Method With Mask-Alignment)

Manufacturing method of the wide bandgap semiconductor device according to the first embodiment is shown in FIGS. 2A to 2G. In silicon DMOSFET, the p-type body and n-type source regions are formed by double diffusion of p- and n-type dopants through a single oxide window, but this process is impractical in SiC due to the small diffusion coefficients for impurities in the material.

Figure 2A:
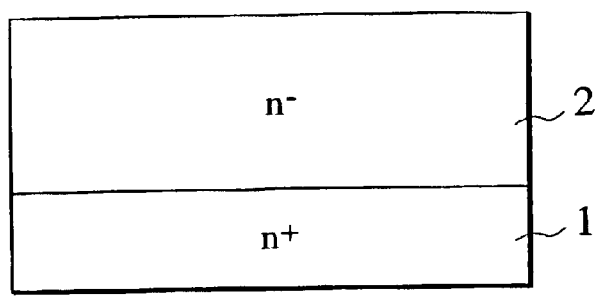
FIGS. 2A to 2G are process sectional views of the wide bandgap semiconductor device shown in FIG. 1.
Figure 2B:
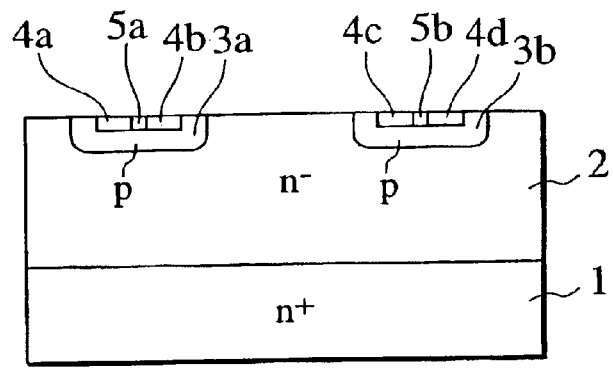
Figure 2C:
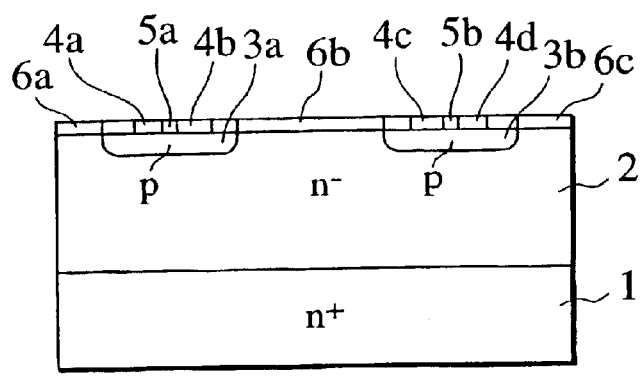

(a) Firstly, an n-type SiC epitaxial layer 2 of low impurity concentration which will serve as the drift layer 2 is grown on an n-type the SiC substrate 1 of high impurity concentration, the SiC substrate 1 serve as the base material of the present invention, as shown in FIG. 2A. Next, p-type impurity ions for the p-body regions 3a, 3b are selectively implanted in the top surface of an epitaxial layer 2. The p-type impurity ions may be one of aluminum (Al), boron (B), gallium (Ga) or beryllium (Be). For example, boron ion ($B^+$) is implanted at 650° C. using a Ti/Au mask to form a 1-$\mu$m deep retrograde p-bodies 3a, 3b in the n-type SiC epitaxial layer 2. To obtain the profile shown in FIG. 2B after activation annealing, "the multiple ion implantation technique" is employed with different acceleration energies $E_{ACC}$ and dose amount $\Phi$ as follows:

$E_{ACC}$=85 KeV, $\Phi$=2.2×10$^{13}$ cm$^{-2}$;
$E_{ACC}$=140 KeV, $\Phi$=3.4×10$^{13}$ cm$^{-2}$;
$E_{ACC}$=230 KeV, $\Phi$=6.0×10$^{13}$ cm$^{-2}$;
$E_{ACC}$=380 KeV, $\Phi$=3.6×10$^{14}$ cm$^{-2}$;

(b) Next, n-type ions for n-type source regions 4a, 4b, 4c, 4d of high impurity concentration are selectively implanted in the area defined by the p-body regions 3a, 3b at top surface of the n-type SiC epitaxial layer 2 as shown in FIG. 2B. The n-type ions may be nitrogen (N), phosphorus (P), or arsenic (As). For example, nitrogen ion ($N^+$) is selectively implanted with different acceleration energies $E_{ACC}$ and dose amount $\Phi$ to form a 0.25-$\mu$m deep source regions 4a, 4b, 4c, 4d as follows:

$E_{ACC}$=40 KeV, $\Phi$=2.5×10$^{15}$ cm$^{-2}$;
$E_{ACC}$=90 KeV, $\Phi$=3.0×10$^{15}$ cm$^{-2}$;
$E_{ACC}$=160 KeV, $\Phi$=5.0×10$^{15}$ cm$^{-2}$;

Furthermore, p-type impurity ions for the p-type body contact regions 5a, 5b of high impurity concentration are selectively implanted in the top surface of n-type SiC epitaxial layer 2 so that the p-type body contact region 5a is surrounded by n-type source regions 4a, 4b, and the p-type body contact region 5b is surrounded by n-type source regions 4c, 4d as shown in FIG. 2C. For example, aluminum ion ($Al^+$) is selectively implanted with different acceleration energies $E_{ACC}$ and dose amount $\Phi$ to form a 0.3-$\mu$m deep body contact regions 5a, 5b as follows:

$E_{ACC}$=45 KeV, $\Phi$=2.2×10$^{14}$ cm$^{-2}$;
$E_{ACC}$=90 KeV, $\Phi$=3.4×10$^{14}$ cm$^{-2}$;
$E_{ACC}$=160 KeV, $\Phi$=5.4×10$^{14}$ cm$^{-2}$;
$E_{ACC}$=270 KeV, $\Phi$=1.1×10$^{15}$ cm$^{-2}$;

Next, n-type ions for n-type wide bandgap channel layers 6a, 6b, 6c are selectively implanted in the area left side of n-type source region 4a, the area defined between the n-type source regions 4b and 4c, and the area right side of the n-type source regions 4d at top surface of the n-type SiC epitaxial layer 2 as shown in FIG. 2C. Then, the SiC substrate (base material) 1 is annealed at high-temperatures of around 1500–1800° C. for 10 to 30 minutes in order to activate these implanted impurity ions in the n-type SiC epitaxial layer 2.

Figure 2D:
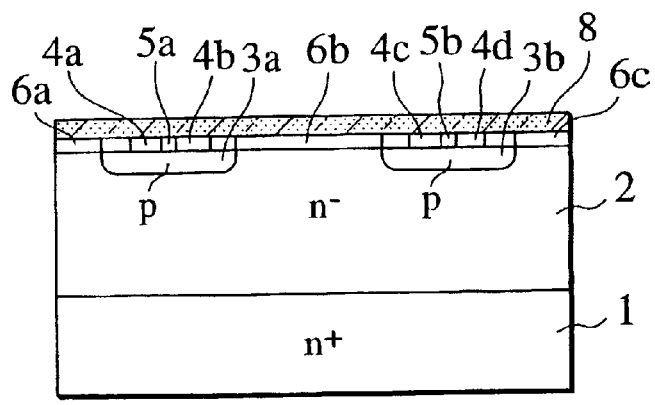

(c) After a chemical treatment to clear the top surface of SiC epitaxial layer 2, an non-dope polysilicon layer 8 is deposited on the entire top surface of the SiC epitaxial layer 2 as shown in FIG. 2D. Because the polysilicon layer 8 is a material, which will serve as the gate electrodes 8a, 8b, 8c, by which desired barrier height is established at the interface between the n-type wide bandgap channel layers 6a, 6b, 6c and the gate electrodes 8a, 8b, 8c, the non-dope polysilicon layer 8 must be doped with impurities to manifest the specific graded doping profile. To obtain the specific graded doping profile in the gate electrodes 8a, 8b, 8c, various doping methodologies can be employed. For example, the solid phase diffusion, by which the impurity included in the diffusion source film disposed on the non-dope polysilicon layer 8 is thermally diffused into polysilicon layer 8 by heat treatment, can be employed so as to provide the graded doped polysilicon layer 8. As the diffusion source film, boro-silicate glass (BSG) or phosphosilicate glass (PSG) can be used for example. Or the gas phase diffusion, by which the impurity included in the source gas ambient is thermally diffused into polysilicon layer 8 by heat treatment, can also be employed. As the source gas, phosphine ($PH_3$), arsine ($AsH_3$), diborane ($B_2H_6$) can be used for example.

Figure 2E:
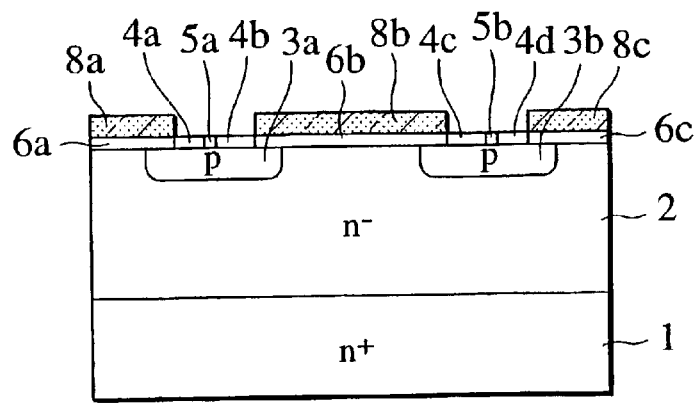

(d) Then the graded doped polysilicon layer 8 is delineated so as to provide the gate electrodes 8a, 8b, 8c as shown in FIG. 2E. In the delineation of the gate electrodes 8a, 8b, 8c, the polysilicon layer 8 is selectively etched by reactive ion etching (RIE) using an etching mask provided by the known photolithography technique, for example, so that only the necessary portion is selectively left for the gate electrodes 8a, 8b, 8c. For the purpose of improving bonding performance between the gate electrodes 8a, 8b, 8c and the n-type wide bandgap channel layers 6a, 6b, 6c, the rapid thermal anneal (RTA) at a high-temperature of around 100° C. in a short time can be employed.

Figure 2F:
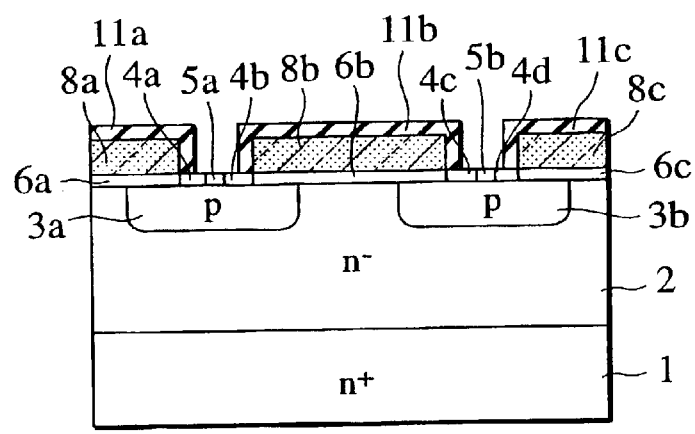
Figure 2G:
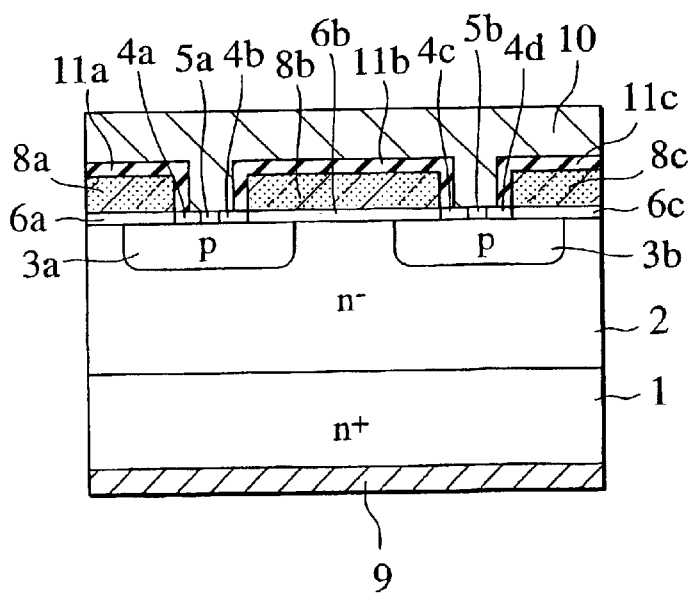

(e) Next, an interlayer insulation film such as a silicon oxide (SiO$_2$) film are blanket deposited on the gate electrodes 8a, 8b, 8c so as to electrically isolate the gate electrodes 8a, 8b, 8c from the source electrode 10, which will be formed from now on, as shown in FIG. 2G. After depositing the interlayer insulation film, the portions in the interlayer insulation film where the source electrode 10 will contact with the n-type source regions 4a, 4b, 4c, 4d as well as the p-type body contact regions 5a, 5b are selectively etched by RIE, using another etching mask provided by the photolithography technique. Then contact holes are opened in the interlayer insulation films 11a, 11b, 11c as shown in FIG. 2F.

(f) After contact holes are opened in the interlayer insulation films 11a, 1b, 11c so as to expose the top surface of the n-type source regions 4a, 4b, 4c, 4d and the p-type body contact regions 5a, 5b, a metallic film such as Ni is evaporated as shown in FIG. 2G. Furthermore, another metallic film such as Ni is evaporated on the bottom surface of the SiC substrate 1 so as to form the drain electrode 9 as shown in FIG. 2G, and the manufacturing method of the wide bandgap semiconductor device according to the first embodiment completes.

As stated above, in the manufacturing method of the wide bandgap semiconductor device according to the first embodiment, well-known processes in a field of a SiC device fabrication are employed, and any special or difficult process is not required.

(Self-Alignment Manufacturing Method)

In the manufacturing method of the wide bandgap semiconductor device shown in FIGS. 2A–2G, the delineation process of the source regions 4a, 4b, 4c, 4d and that of the gate electrodes 8a, 8b, 8c are achieved by different photolithography processes, respectively. If impurity doped in the polysilicon layer 8 is n-type impurity, the doping process to the gate electrodes 8a, 8b, 8c and to the source regions 4a, 4b, 4c, 4d can be achieved in "self-alignment process" by doping the n-type impurity simultaneously. The manufacturing method of the wide bandgap semiconductor device shown in FIGS. 3A to 3G is basically similar to the manufacturing method shown in FIGS. 2A to 2G.

Figure 3A:
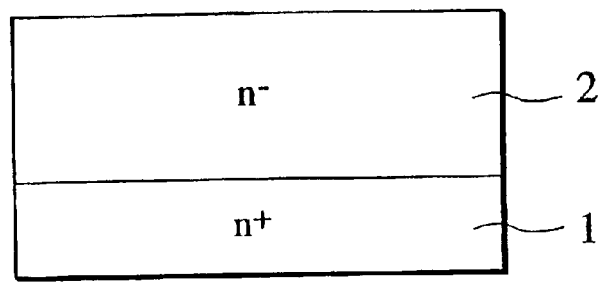
FIGS. 3A to 3G are another process sectional views of the wide bandgap semiconductor device shown in FIG. 1.
Figure 3B:
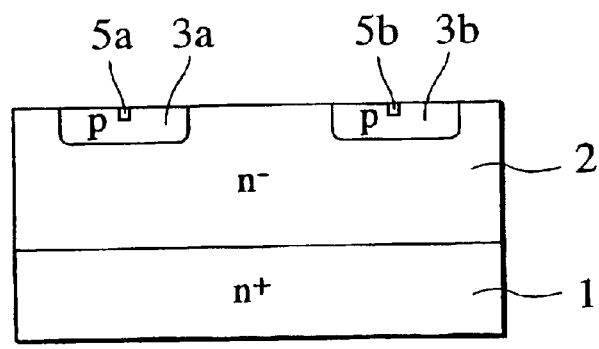

(a) Firstly, an n-type SiC epitaxial layer (drift layer) 2 of low impurity concentration is grown on an n-type the SiC substrate (base material) 1 of high impurity concentration, and p-type impurity ions for the p-body regions 3a, 3b are selectively implanted in the top surface of an epitaxial layer 2 similar to the process sequence shown in FIGS. 2A and 2B. However, different from the process shown in FIG. 2B, the n-type ions for the source regions 4a, 4b, 4c, 4d are not implanted to the top surface of the n-type SiC epitaxial layer 2 at this stage. Thus omitting the ion implantation for the source regions 4a, 4b, 4c, 4d, the p-type impurity ions for the body contact regions 5a, 5b of high impurity concentration are selectively implanted in the top surface of n-type SiC epitaxial layer 2 as shown in FIG. 3B.

Figure 3C:
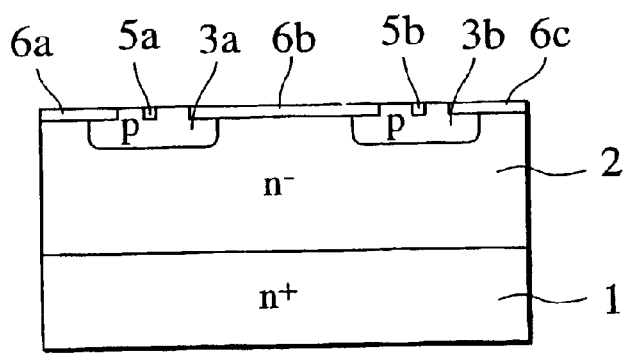

(b) Next, n-type ions for n-type wide bandgap channel layers 6a, 6b, 6c are selectively implanted in the area left side of the p-body regions 3a, the area defined between the p-body regions 3a and 3b, and the area right side of the p-body region 3b at the top surface of the n-type SiC epitaxial layer 2 as shown in FIG. 3C. Then, the SiC substrate 1 is annealed at high-temperatures of around 1500–1800° C. for 10 to 30 minutes in order to activate these implanted impurity ions in the n-type SiC epitaxial layer 2.

Figure 3D:
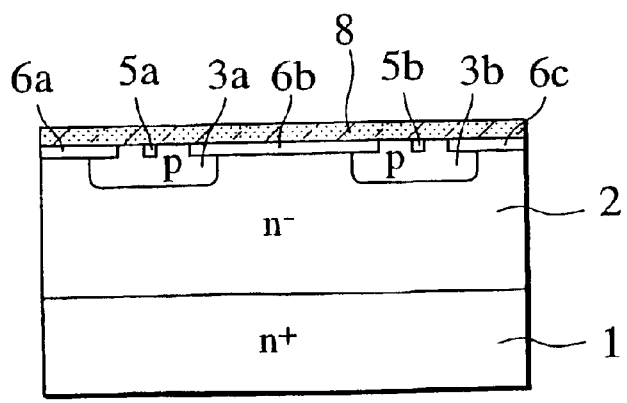
Figure 3E:
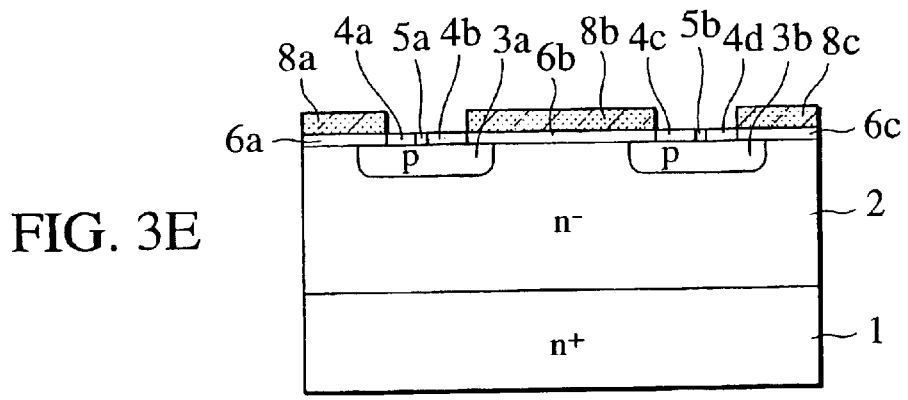

(c) After a chemical treatment to clear the top surface of SiC epitaxial layer 2, an non-dope polysilicon layer 8 is deposited on the entire top surface of the SiC epitaxial layer 2 as shown in FIG. 3D. Then the non-dope polysilicon layer 8 is delineated so as to provide the patterns of the gate electrodes 8a, 8b, 8c as shown in FIG. 3E. In the delineation of the gate electrodes 8a, 8b, 8c, the polysilicon layer 8 is selectively etched by RIE using an etching mask provided by the known photolithography technique.

(d) Thereafter, n-type impurity ions are blanket implanted into the gate electrodes 8a, 8b, 8c and the window part of the gate electrodes 8a, 8b, 8c, where portions of the top surface of SiC epitaxial layer 2 are exposed. Then, the SiC substrate 1 is annealed at temperatures of around 1200° C. for 10 to 30 minutes in order to activate the implanted n-type impurity ions in the n-type SiC epitaxial layer 2 so as to form the n-type source regions 4a, 4b, 4c, 4d as shown in FIG. 3E. In this way, the graded doped polysilicon gate electrodes 8a, 8b, 8c and the source regions 4a, 4b, 4c, 4d are formed simultaneously in "self-alignment process". By the anneal at temperatures of around 1200° C., the non-dope polysilicon layer 8 can be doped with impurities to manifest the required specific graded doping profile, such that the respective bottom portions of the gate electrodes 8a, 8b, 8c maintain insulating characteristic.

Figure 3F:
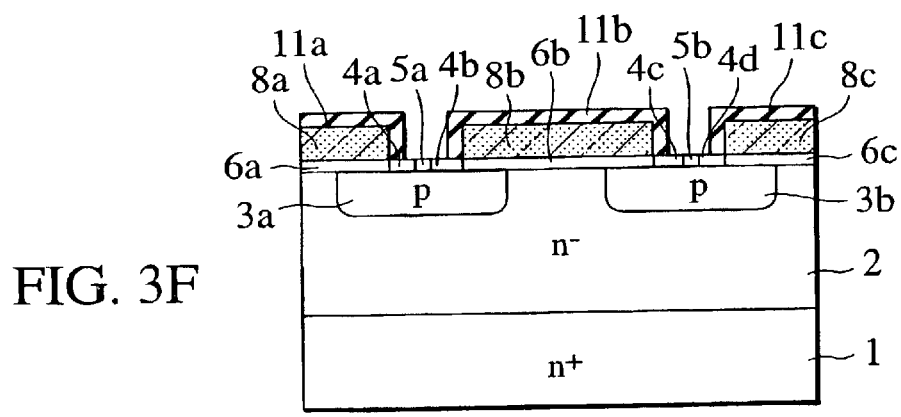
Figure 3G:
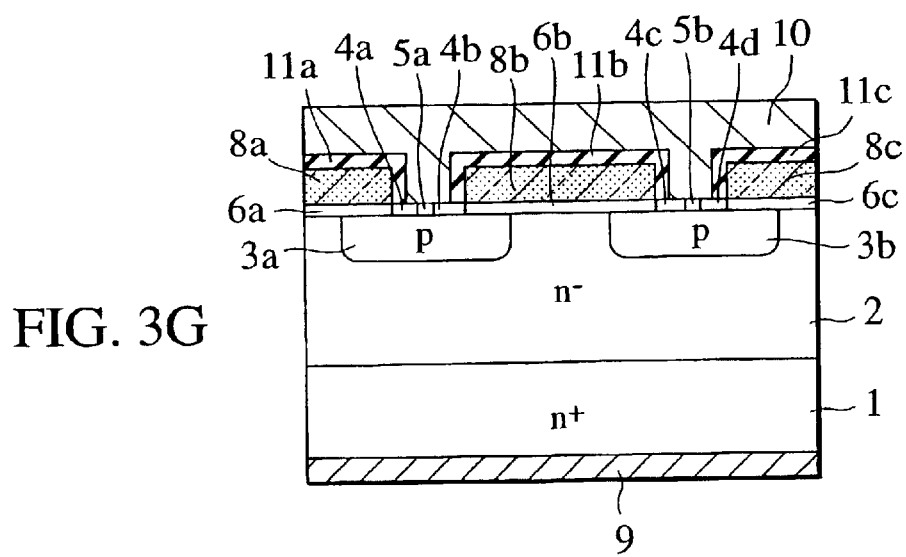

(e) Next, an interlayer insulation film are blanket deposited on the gate electrodes 8a, 8b, 8c, and the portions of the interlayer insulation film are selectively etched so as to open contact holes in the interlayer insulation films 11a, 11b, 11c as shown in FIG. 3F. After contact holes are opened in the interlayer insulation films 11a, 11b, 11c, a metallic film is evaporated so as to form the source electrode 10 as shown in FIG. 3G. Furthermore, another metallic film is evaporated on the bottom surface of the SiC substrate 1 so as to form the drain electrode 9 as shown in FIG. 3G, and the manufacturing method of the wide bandgap semiconductor device according to the first embodiment completes.

In the self-alignment manufacturing method of the wide bandgap semiconductor device shown in FIGS. 3A–3G, similar miniaturization effect of the wide bandgap semiconductor device is achieved as the manufacturing method of the wide bandgap semiconductor device shown in FIGS. 2A–2G. In addition, because there is no problem of mask pattern aligning associated with the gate electrodes 8a, 8b, 8c and the source regions 4a, 4b, 4c, 4d in the photolithograph process, the manufacturing method of the wide bandgap semiconductor device can be simplified. Therefore, a special effectiveness that the dispersion of device performances of the wide bandgap semiconductor devices ascribable to the dispersion of the manufacturing processes can be minimized is achieved.

Consequently, in light of the above discussion, because this is no requirement to provide a spatial margin between the gate electrodes 8a, 8b, 8c and the source regions 4a, 4b, 4c, 4d, in the self-alignment manufacturing method of the wide bandgap semiconductor device, remarkable miniaturization of the wide bandgap semiconductor device can be achieved. Furthermore, the specific on-resistance per unit area can be reduced.

Second Embodiment (Device Structure)

Figure 4:
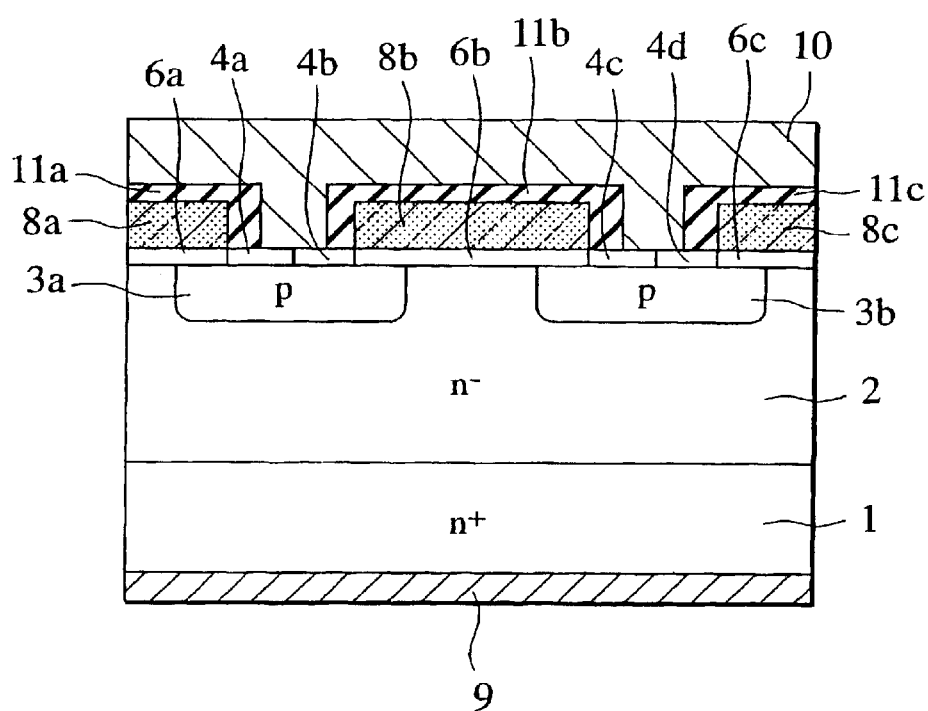
FIG. 4 is a cross sectional view of a wide bandgap semiconductor device of the second embodiment of the present invention.

FIG. 4 shows two unit cells of a wide bandgap semiconductor device of the second embodiment. Similar to the configuration explained in the first embodiment actually a plurality of unit cells more than two are connected in parallel to achieve a large current handling capability. On an n-type SiC substrate (base material) 1 having a high impurity concentration, an n-type SiC drift layer 2 having a low impurity concentration is formed. At the top surface of and in the drift layer 2, p-body regions 3a, 3b are formed. At the top surface of and in the p-body region 3a, n-type source regions 4a, 4b of high impurity concentration are formed. And at the top surface of and in the p-body region 3b, n-type source regions 4c, 4d of high impurity concentration are formed.

However the p-type body contact regions 5a, 5b of high impurity concentration, which are formed in the p-body regions 3a, 3b shown in FIG. 1, are not illustrated in the cross sectional view of FIG. 4. For the device explained in the first embodiment n-type source regions 4a, 4b and the p-type body contact regions 5a, 5b are mutually short-circuited by the metallic source electrode 10. On the contrary, in the wide bandgap semiconductor device of the second embodiment, although the illustration is omitted, electrically independent p-type body contact regions of high impurity concentration are formed at the top surface of n-type SiC drift layer 2 disposed at deep side in the paper depth direction so that the potential of the p-body regions 3a, 3b is controlled by different potential from that of source electrode 10. That is, the p-body regions 3a, 3b are electrically contacted with another metallic interconnections at deep side from the plane of the paper. Although the portions are so deep in the paper depth direction that the representation is omitted in the cross sectional view of FIG. 4, where the ohmic contacts between the p-body regions 3a, 3b and another metallic interconnections, the portions serve as electrically independent terminals for controlling the potential of the p-body regions 3a, 3b. In top surface portions of the drift layer 2, aside from the area where the source regions 4a, 4b, 4c, 4d, the n-type wide bandgap channel layers 6a, 6b, 6c are formed, respectively.

Gate electrodes 8a, 8b, 8c having a different band gap energy from that of wide bandgap channel layers 6a, 6b, 6c are formed on the n-type wide bandgap channel layers 6a, 6b, 6c, respectively. As explained in the first embodiment, each of the gate electrodes 8a, 8b, 8c are made of graded-doped-polysilicon so that Schottky barriers can be formed between the n-type wide bandgap channel layers 6a, 6b, 6c and the gate electrodes 8a, 8b, 8c, respectively, achieving very low impurity concentration at the bottom surface of the gate electrodes 8a, 8b, 8c. And the source electrode 10 achieves the ohmic contact only with the source regions 4a, 4b, 4c, 4d. On the bottom surface of the SiC substrate 1, a drain electrode 9 is disposed so that the drain electrode 9 can make an ohmic contact with the SiC substrate 1. Other detailed structure and materials are essentially similar to the structure and materials already explained in the first embodiment, and the overlapped description or the redundant description may be omitted in the second embodiment.

(Operation Mode)

The basic operation of the wide bandgap semiconductor device according to the second embodiment is essentially similar to the operation already explained in the first embodiment, and the overlapped description or the redundant description may be omitted in the second embodiment, therefore different portions of the operation is mainly explained.

Junction FET Mode:

As already explained, electrically independent p-type body contact regions of high impurity concentration are formed at the top surface of n-type SiC drift layer 2 disposed at deep side in the paper depth direction, and the potential of the p-body regions 3a, 3b is controlled by different bias potential from that of source electrode 10. Therefore, it is possible to achieve an operation resembling to that of the junction FET, in which the ohmic contact electrodes between the p-body regions 3a, 3b and another metallic interconnections, or the electrically independent terminals disposed at deep side in the paper depth direction serves as control electrodes for controlling the potential of the p-body regions 3a, 3b. In this junction FET mode, the gate electrodes 8a, 8b, 8c are normally connected to the source electrode 10, for example, and p-body regions 3a, 3b serves as active gate regions in the junction FET or junction static induction transistor (SIT).

In the off-state of the wide bandgap semiconductor device in the junction FET mode, the potential of the p-body regions (active gate regions) 3a, 3b are set equal to the potential of the source electrode 10 so that each of the n-type wide bandgap channel layers 6a, 6b, 6c is pinched off, and further the depletion layer extends from a pn junction formed between the n-type the drift layer 2 and the p-body regions 3a, 3b so that current path between the source electrode 10 and drain electrode is blocked by the barrier height generated by the depletion layer extending from the interface between the n-type the drift layer 2 and the p-body regions 3a, 3b.

In the on-state of the wide bandgap semiconductor device in the junction FET mode, a positive voltage is applied to the of the p-body regions (active gate regions) 3a, 3b with reference to the potential of the source electrode 10, during a high voltage is applied to the drain electrode 9 with reference to the potential of the source electrode 10, while the gate electrodes 8a, 8b, 8c keep connection with the source electrode 10. In this bias condition, the depletion layers just under the gate electrodes 8a, 8b, 8c retreat in the respective wide bandgap channel layers 6a, 6b, 6c so as to provide current paths. Then, current flows from the drain electrode 9, through the SiC substrate 1, the SiC drift layer 2, the wide bandgap channel layers 6a, 6b, 6c to the source regions 4a, 4b, 4c, 4d, and finally to the source electrode 10. In addition, when voltages being applied to the p-body regions (active gate regions) 3a, 3b increases, carriers (holes) are injected from the p-body regions (active gate regions) 3a, 3b to the n-type drift layer 2 so as to generate so-called "conductivity modulation", thereby reducing the specific on-resistance.

In this way, by using the p-body regions 3a, 3b as the active gate regions, or the active control electrode regions, the wide bandgap semiconductor device having high breakdown voltage with reduced specific on-resistance can be provided.

Composite MOS FET Mode:

In the device configuration shown in FIG. 4, electrically independent p-type body contact regions of high impurity concentration are formed at the top surface of n-type SiC drift layer 2 disposed at deep side in the paper depth direction, and the potential of the p-body regions 3a, 3b can be controlled by different bias potential from that of source electrode 10. Therefore, it is possible to achieve an operation resembling to that of the composite MOS FET, in which the ohmic contact electrodes between the p-body regions 3a, 3b and another metallic interconnections, or the electrically independent terminals disposed at deep side in the paper depth direction serves as first control electrodes for controlling the potential of the p-body regions 3a, 3b. Contrary to the junction FET mode, the gate electrodes 8a, 8b, 8c are not connected to the source electrode 10 and independent bias voltages are applied so that the gate electrodes 8a, 8b, 8c can serve as second control electrodes in this composite MOS FET mode. Similar to the junction FET mode, the p-body regions 3a, 3b serves as active gate regions in the composite MOS FET or composite MOS SIT.

In the off-state of the wide bandgap semiconductor device in the composite MOS FET mode, the potential of the p-body regions (active gate regions) 3a, 3b are set equal to the potential of the source electrode 10 so that each of the n-type wide bandgap channel layers 6a, 6b, 6c is pinched off, and further the depletion layer extends from a pn junction formed between the n-type the drift layer 2 and the p-body regions 3a, 3b so that current path between the source electrode 10 and drain electrode is blocked by the barrier height generated by the depletion layer extending from the interface between the n-type the drift layer 2 and the p-body regions 3a, 3b.

In the on-state of the wide bandgap semiconductor device in the composite MOS FET mode, a positive voltage is applied through the first control electrodes to the p-body regions (active gate regions) 3a, 3b with reference to the potential of the source electrode 10, during a high voltage is applied to the drain electrode 9 with reference to the potential of the source electrode 10. At the same time, another positive voltage is applied to the gate electrodes (second control electrodes) 8a, 8b, 8c with reference to the potential of the source electrode 10. In this bias condition, the depletion layers just under the gate electrodes 8a, 8b, 8c retreat in the respective wide bandgap channel layers 6a, 6b, 6c so as to provide current paths. Then, current flows from the drain electrode 9, through the SiC substrate 1, the SiC drift layer 2, the wide bandgap channel layers 6a, 6b, 6c to the source regions 4a, 4b, 4c, 4d, and finally to the source electrode 10. In addition, when voltages being applied to the p-body regions (active gate regions) 3a, 3b increases, carriers (holes) are injected from the p-body regions (active gate regions) 3a, 3b to the n-type drift layer 2 so as to generate the conductivity modulation explained in the junction FET mode, thereby reducing the specific on-resistance same way.

In this way, by using the p-body regions 3a, 3b as the active gate regions, or the active control electrode regions, the wide bandgap semiconductor device having high breakdown voltage with reduced specific on-resistance can be provides.

As shown in FIG. 4, in the wide bandgap semiconductor device according to the second embodiment, the vertical configuration that the drain electrode 9 is formed at the bottom surface of the SiC substrate 1 was explained, but the drain electrode can be disposed on the top surface to implement a lateral device configuration. It is a matter of course that very similar technical advantages can be achieved by the lateral device configuration.

As for the manufacturing method of the wide bandgap semiconductor device according to the second embodiment, the method are essentially similar to the process sequence already explained in the first embodiment with reference to FIGS. 2A–2G and 3A–3G, and the overlapped description or the redundant description may be omitted in the second embodiment except that the p-type body contact regions 5a, 5b are not formed in the p-body regions 3a, 3b on the cross sectional plane shown in FIGS. 1, 2A–2G and 3A–3G are not illustrated in the cross sectional view of FIG. 4. However, the electrically independent p-type body contact regions of high impurity concentration are formed anywhere at the top surface of n-type SiC drift layer 2, which are disposed at deep side in the paper depth direction, we can conclude that the same process sequence can be applied to the manufacturing method of the second embodiment, the method. The differences may be mask patterns employed in the selective ion implantation and metallization processes. Anyhow, the standard manufacturing method of the SiC can be used in the manufacturing method of the wide bandgap semiconductor device according to the second embodiment.

Other Embodiments

Various modifications will become possible for those skilled in the art after receiving the teaching of the present disclosure without departing from the scope thereof.

In the first and second embodiments, each of the semiconductor gate electrodes 8a, 8b, 8c has different band gap energy from that of wide bandgap channel layers 6a, 6b, 6c and impurities are doped in the semiconductor gate electrodes 8a, 8b, 8c to achieve the desired doping profile, the impurity concentration gradually decreases from top to bottom so that the bottom portions of the semiconductor gate electrodes 8a, 8b, 8c, where edges of the semiconductor gate electrodes 8a, 8b, 8c are positioned closely to the source regions 4a, 4b, 4c, 4d, are very lightly doped or not doped with impurity. That is, each of the semiconductor gate electrodes 8a, 8b, 8c has a non-uniform doping profile, achieving insulating characteristics at the bottom surface of the semiconductor gate electrodes 8a, 8b, 8c. To that end, the bottom surface of the semiconductor gate electrodes 8a, 8b, 8c can be made of semi insulating polysilicon (SIPOS) which includes oxygen at mole fraction of around 10%. The structure having the SIPOS film at the bottom of the semiconductor gate electrodes 8a, 8b, 8c is preferable to the self-alignment manufacturing method of the wide bandgap semiconductor device shown in FIGS. 3A–3G, because the SIPOS film can protect the bottom of the semiconductor gate electrodes 8a, 8b, 8c from becoming conductive material due to the excess diffusion of the impurity at the thermal anneal of the SiC substrate 1 at temperatures of around 1200° C. for activating the implanted n-type impurity ions in the n-type SiC epitaxial layer (drift layer) 2 so as to form the n-type source regions 4a, 4b, 4c, 4d as shown in FIG. 3E.

Furthermore, thin film of refractive metal such as tungsten (W), molybdenum (Mo), titanium (Ti), or cobalt (Co) can cover the top surface of semiconductor gate electrodes 8a, 8b, 8c, before the n-type impurity ions are blanket implanted into the gate electrodes 8a, 8b, 8c and the window part of the semiconductor gate electrodes 8a, 8b, 8c, where portions of the top surface of SiC epitaxial layer (drift layer) 2 are exposed in the self-alignment manufacturing method so as to achieve shallow projected range $R_P$ of the n-type impurity ions in the top portion of the semiconductor gate electrodes 8a, 8b, 8c so as to protect the excess diffusion of the impurity at the thermal anneal of the SiC substrate 1 at temperatures of around 1200° C. If the refractive metal is thin enough, only the top portion of the semiconductor gate electrodes 8a, 8b, 8c becomes refractive metal silicide such as $WSi_2$, Mo $Si_2$, Ti $Si_2$, Co $Si_2$ by the thermal anneal at temperatures of around 1200° C. thus reducing the overall resistivity of the semiconductor gate electrodes 8a, 8b, 8c That is the gate electrodes 8a, 8b, 8c can have multilayer structure. In this multilayer structure having metal silicide top layer, it is possible to include the SIPOS film at the bottom of the gate electrodes 8a, 8b, 8c.

To form the single crystalline silicon gate electrodes 8a, 8b, 8c, the Si epitaxial growth method on the top surface of SiC epitaxial layer 2 can be employed. However, instead of the Si epitaxial growth method, well-known silicon direct bonding (SDB) method can also be employed. In the SDB method, after a chemical treatment to clear the top surface of SiC epitaxial layer 2, in which the p-body region 3a, 3b, the source regions 4a, 4b, 4c, 4d, the p-type body contact regions 5a, 5b, the wide bandgap channel layers 6a, 6b, 6c are formed, a silicon substrate which will serve as the single crystalline silicon gate electrodes 8a, 8b, 8c will directly bonded to the top surface of SiC epitaxial layer 2. In this case, the silicon substrate having a mirror surface is prepared. And as shown in FIG. 2D, an SDB structure can be obtained by mating the top surface of SiC epitaxial layer 2 and the mirror surface of the silicon substrate together, and then annealing at 1100° C. for one or two hours. At that time, annealing may be conducted while applying voltage to the substrate. Then, a thickness of the SDB structure is adjusted by grinding, polishing the back surface of the silicon substrate to a required thickness. Thereafter the single crystalline silicon film is doped with impurities to manifest the specific graded doping profile. And following process sequence is exactly same as shown in FIGS. 2E–2G.

Although in the first and second embodiments, the first conductivity type is assigned as n-type, and the second conductivity type is assigned as p-type, we can assign the first conductivity type p-type, and the second conductivity type n-type. When the assignment has reversed, the polarity used in the explanation of the operation of the wide bandgap semiconductor device must be perfectly reversed, of course.

In the case that the n-type SiC epitaxial layer 2 serves as the drift layer 2 in the first and second embodiments are described in the first and second embodiments, but the bulk substrate can serves as the drift layer 2, when a very high blocking voltage is required. In this case, an epitaxial layer grown on the bottom surface of the drift layer 2 will implement the drain region 1. That is, the drain region 1 can be obtained by doping epitaxy on the high resistivity SiC substrate.

In the first and second embodiments, only SiC device is described, but present invention is, of course, applicable to other wide bandgap semiconductor materials such as GaN or diamond.

Thus, the present invention of course includes various embodiments and modifications and the like which are not detailed above. Therefore, the scope of the present invention will be defined in the following claims.

This application claims benefit of priority under 35 USC 119 based on Japanese Patent Application No. 2002-12807 filed Apr. 24, 2002, the entire contents of which are incorporated by reference herein

What is claimed is:

1. A wide bandgap semiconductor device comprising:
   a drift layer of a first conductivity type made of a wide bandgap semiconductor material;
   a body region of a second conductivity type opposite to the first conductivity type made of the wide bandgap semiconductor material, disposed at the top surface of and in the drift layer;
   a source region of the first conductivity type made of the wide bandgap semiconductor material, disposed at the top surface of and in the body region;
   a channel layer of the first conductivity type made of the wide bandgap semiconductor material, disposed at the top surface of and in the body region neighboring to the source region and further disposed at the top surface of and in the drift layer; and
   a gate electrode including semiconductor layer at the bottom so that the semiconductor layer directly contact with the top surface of the channel layer, the semiconductor layer made of a semiconductor material having a different bandgap energy from that of the wide bandgap semiconductor material.

2. The wide bandgap semiconductor device of claim 1, wherein an edge of the gate electrode reaches to the source region.

3. The wide bandgap semiconductor device of claim 1, wherein at least lower portion of the gate electrode comprises the semiconductor layer in which impurities are doped in an nonuniform profile so that the bottom of the gate electrode can manifest a high resistivity characteristics.

4. The wide bandgap semiconductor device of claim 3, wherein the impurity concentration decreases from the top surface of the gate electrode to the bottom surface so that the bottom of the gate electrode can manifest the high resistivity characteristics.

5. The wide bandgap semiconductor device of claim 1, wherein at least lower portion of the gate electrode comprises silicon layer in which impurities are doped in an nonuniform profile so that the bottom of the silicon layer can manifest a high resistivity characteristics.

6. The wide bandgap semiconductor device of claim 5, wherein the silicon layer is selected from the group consisting of an amorphous silicon, a polysilicon and a single crystalline silicon.

7. The wide bandgap semiconductor device of claim 5, wherein the impurity concentration decreases from the top surface of the silicon layer to the bottom surface so that the bottom of the silicon layer can manifest the high resistivity characteristics.

8. The wide bandgap semiconductor device of claim 5, wherein the impurity atoms doped in the upper portion differs from the impurity atoms doped in the lower portion of silicon layer.

9. The wide bandgap semiconductor device of claim 8, wherein the impurity atoms doped in the upper portion of the silicon layer are one of donor impurity atoms and acceptor impurity atoms, and the impurity atoms doped in the lower portion of the silicon layer is oxygen atoms.

10. The wide bandgap semiconductor device of claim 1, wherein the wide bandgap semiconductor material is silicon carbide.

11. The wide bandgap semiconductor device of claim 1, further comprising a body contact region of the second conductivity type made of the wide bandgap semiconductor material, disposed at the top surface of and in the body region.

12. The wide bandgap semiconductor device of claim 1, wherein the source region surrounds the periphery of the body contact region in a ring shape.

13. The wide bandgap semiconductor device of claim 1, further comprising a source electrode contacting to the source region.

14. The wide bandgap semiconductor device of claim 11, further comprising a source electrode contacting both to the source region and the body contact region.

15. The wide bandgap semiconductor device of claim 11, further comprising a metallic interconnect contacting independently to the body contact region so as to apply different potential to the body region from the source region.

16. The wide bandgap semiconductor device of claim 1, further comprising a drain region contacting to drift layer.

17. The wide bandgap semiconductor device of claim 16, further comprising a drain electrode contacting to drain region.

18. A wide bandgap semiconductor device made of wide bandgap semiconductor material for controlling current flowing from source means to drain means by gate means, comprising:
   drift means for transporting carriers by drift field between the source means and drain means;

body means disposed in the drift means for storing the carriers to be injected into the drift means;

source means disposed in the body means for providing the carriers so that the carriers can serve as the current flowing from the source means to the drain means;

channel means disposed at the top surface of the body means neighboring to the source means and further disposed at the top surface of the drift means for providing a current path between the source means and drain means; and gate means directly contact with the top surface of the channel means so that an edge of gate means reaches to the source means, for controlling potential in the channel means, and simultaneously for achieving electrical isolation between the gate means and source means.

* * * * *